(12) United States Patent
Hoffmann

(10) Patent No.: US 10,140,397 B2
(45) Date of Patent: Nov. 27, 2018

(54) COMPUTER-IMPLEMENTABLE METHOD FOR USE WITH A SURGE ARRESTER

(71) Applicant: EPCOS AG, Munich (DE)

(72) Inventor: Robert Hoffmann, Berlin (DE)

(73) Assignee: EPCOS AG, Munich (DE)

( * ) Notice: Subject to any disclaimer, the term of this patent is extended or adjusted under 35 U.S.C. 154(b) by 273 days.

(21) Appl. No.: 15/106,258

(22) PCT Filed: Nov. 14, 2014

(86) PCT No.: PCT/EP2014/074651
§ 371 (c)(1),
(2) Date: Jun. 17, 2016

(87) PCT Pub. No.: WO2015/090767
PCT Pub. Date: Jun. 25, 2015

(65) Prior Publication Data
US 2016/0300002 A1    Oct. 13, 2016

(30) Foreign Application Priority Data

Dec. 19, 2013    (DE) .................. 10 2013 114 546

(51) Int. Cl.
*G06F 17/50* (2006.01)
*H02H 9/04* (2006.01)

(52) U.S. Cl.
CPC ...... *G06F 17/5009* (2013.01); *G06F 17/5036* (2013.01); *H02H 9/04* (2013.01)

(58) Field of Classification Search
CPC .. G06G 7/122; G06F 17/5022; G06F 17/5036
USPC .................................. 703/3, 4, 14
See application file for complete search history.

(56) References Cited

U.S. PATENT DOCUMENTS

| 2005/0172246 | A1 | 8/2005 | Logie et al. |
| 2014/0015555 | A1* | 1/2014 | Fox .............. G01R 31/40 324/750.01 |
| 2015/0077894 | A1* | 3/2015 | Daeumer .......... H01T 1/20 361/118 |

FOREIGN PATENT DOCUMENTS

| JP | 2004266963 A | 9/2004 |
| JP | 2005333086 A | 12/2005 |

OTHER PUBLICATIONS

Basso, C., "Spark Gap Modeling," Intusoft Newsletter, Sep. 1997, pp. 1-5, Issue 50.

Boenisch, S. et al.: "Measurement and Simulation of the Behavior of a Short Spark Gap Used as ESD Protection Device," IEEE International Symposium on Electromagnetic Compatibility, Aug. 18-22, 2003, pp. 37-42, vol. 1.

(Continued)

*Primary Examiner* — Andy Ho
(74) *Attorney, Agent, or Firm* — Slater Matsil, LLP

(57) ABSTRACT

A computer-implementable method for simulating the electrical behavior of a surge arrester comprises providing a model of the surge arrester with a switchable current path between an anode and a cathode of the surge arrester, wherein the current path comprises a controllable voltage source. The current path is switched into the conducting or blocked state depending on a determined value of a voltage rise of an input voltage present between the anode and the cathode and a determined level of a response voltage. A level of the voltage of the controllable voltage source is set depending on a level of a current flowing in the current path.

19 Claims, 2 Drawing Sheets

(56) References Cited

OTHER PUBLICATIONS

EPCOS: "PSpice Model for Surge Arresters-Analog Behavioral Model for Circuit Simulation," EPCOS Product Brief 2012, Apr. 2012, pp. 1-2.

Larsson, A. et al.: "Numerical Simulation of Gas Discharge Protectors—A Review," IEEE Transactions on Power Delivery, Apr. 1999, pp. 405-410, vol. 14, No. 2.

Ribic, J. et al.: "Overvoltage Protection Using a Gas Discharge Arrester Within the MATLAB Program Tool," IEEE Transactions on Power Delivery, Oct. 2007, pp. 2199-2206, vol. 22, No. 4.

"TDK Brochure Features PSpice Model for EPCOS Surge Arresters," http://www.electronicproducts.com/News/TDK_brochure_features_PSpice_model_for_EPCOS_surge_arresters.aspx; Electronic Products Article, May 28, 2012, p. 1.

Zola, J.G., "Gas Discharge Tube Modeling With PSpice," IEEE Transactions on Electromagnetic Compatibility, Nov. 2008, pp. 1022-1025, vol. 50, No. 4.

\* cited by examiner

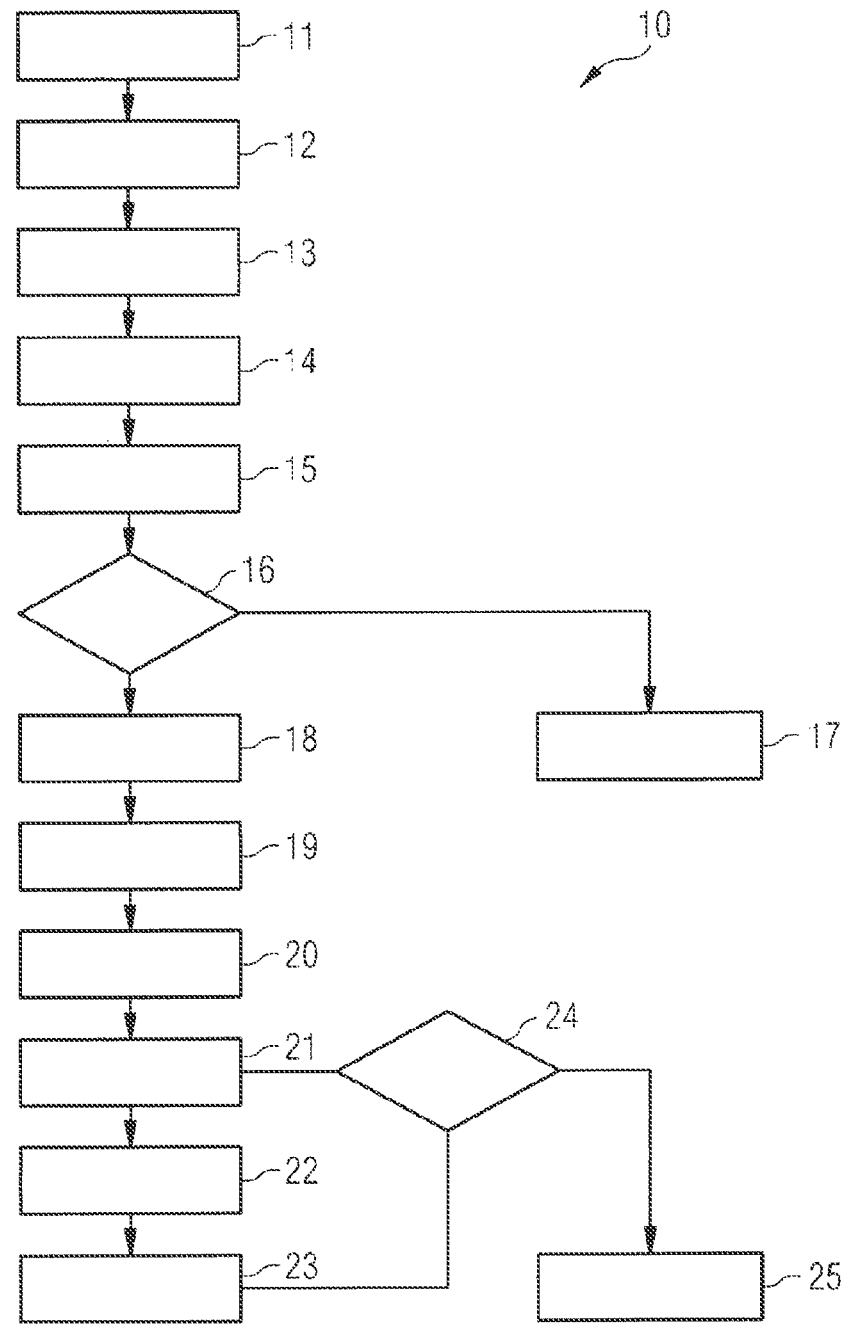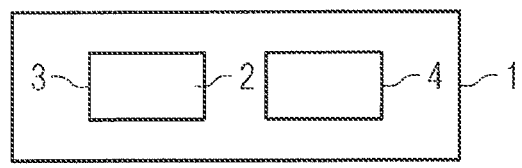

COMPUTER-IMPLEMENTABLE METHOD FOR USE WITH A SURGE ARRESTER

This patent application is a national phase filing under section 371 of PCT/EP2014/074651, filed Nov. 14, 2014, which claims the priority of German patent application 10 2013 114 546.9, filed Dec. 19, 2013, each of which is incorporated herein by reference in its entirety.

TECHNICAL FIELD

The invention relates to a computer-implementable method for simulating the electrical behavior of a surge arrester, in particular of a gas-filled surge arrester. The invention furthermore relates to a computer program product comprising instructions for performing a computer-implementable method for simulating the electrical behavior of a surge arrester by means of a processor of a computer.

BACKGROUND

Gas-filled surge arresters operate according to the gas-physical principle of the arc discharge. The surge arrester behaves electrically like a voltage-dependent switch. As soon as the voltage applied between anode and cathode of the surge arrester exceeds the level of an ignition or response voltage, an arc forms within fractions of a second in a gas-tight discharge space of the surge arrester. The high current-carrying capacity and the virtually current-independent running voltage of the arc short-circuit the overvoltage. After the influencing has subsided, the surge arrester extinguishes and the internal resistance reassumes its original operating state with several 100 MΩ.

During the rise of the input voltage between anode and cathode of the surge arrester until the level of the response voltage is reached, virtually no current flows through the surge arrester. After the surge arrester has ignited, the voltage collapses to the so-called corona running voltage, which has a level of between 70 V and 200 V for example in the case of a current of a few 10 mA to approximately 1.5 A, in the corona region. The transition to the arc discharge takes place as the current rises further in the surge arrester. The extremely low arc running voltage which is characteristic of this region, and which is between 10 V and 35 V, for example, is independent of the current within wide limits. As the overvoltage decreases, the current in the arc is depleted until the level of a minimum current of the surge arrester required for maintaining the arc discharge is undershot. The arc discharge breaks down and the surge arrester extinguishes after passing through the corona phase.

Prior to real construction of an electrical circuit in hardware, it is helpful to simulate the behavior of the circuit in order to detect errors in the circuit design or to optimize the circuit. Circuit simulation programs, such as PSpice, for example, comprise models or libraries for simulating a multiplicity of electrical components. However, simulating the behavior of a gas-filled surge arrester or a spark gap is not possible, or is possible only to a limited extent, at the present time.

SUMMARY OF THE INVENTION

Embodiments of the present invention specify a computer-implementable method for simulating the electrical behavior of a surge arrester with which the real behavior of the surge arrester can be simulated as well as possible and which can be integrated into a circuit simulation program in the simplest possible way. Further embodiments of the present invention specify a computer program product for storage on a computer-readable storage medium, wherein the computer program product comprises instructions for performing a computer-implementable method for simulating the electrical behavior of a surge arrester which are executable by means of a processor of a computer.

One possible embodiment method entails providing a model of the surge arrester having a switchable current path between an anode and a cathode of the surge arrester, wherein the current path comprises a controllable voltage source and is switchable into a conducting or blocked state. The current path is designed in such a way that in the conducting state of the current path a current flow through the current path occurs if an input voltage of the surge arrester is present between the anode and the cathode, and in the blocked state of the current path the current flow in the current path is interrupted. The method entails applying an input voltage between the anode and the cathode. A polarity of the input voltage is determined. A first level of a voltage of the controllable voltage source is generated with a polarity dependent on the polarity of the input voltage. A value of a voltage rise of the input voltage is determined. A level of a response voltage of the surge arrester is determined depending on the determined value of the voltage rise of the input voltage. The current path is switched into the conducting or blocked state depending on the level of the input voltage and the determined level of the response voltage. A current is generated in the current path at a first time if the current path is switched into the conducting state. A level of the current generated at the first time in the current path is determined. The first level or a second level—different than the first level—of the voltage of the controllable voltage source is generated depending on the determined level of the current generated at the first time. A polarity of the voltage of the controllable voltage source is generated depending on the polarity of the level of the input voltage. The current in the current path is determined at a second time succeeding the first time with a level depending on the level of the input voltage and the set level of the voltage of the controllable voltage source if the current path is switched into the conducting state.

One embodiment of a computer program product for storage on a computer-readable storage medium comprising instructions for performing a computer-implementable method for simulating the electrical behavior of a surge arrester according to the embodiment specified above by means of a processor of a computer is specified herein.

The method and the computer program product enable the functional simulation of the behavior of a gas-filled surge arrester or a spark gap embedded into an environment of a circuit simulation program, for example a simulation by means of PSpice. The method can be implemented with an ABM (Analog Behavioral Model) on the basis of Orcad PSpice. A finite state machine that simulates the essential phases of the surge arrester or spark gap function is created by means of suitable components.

The model is largely scalable and variable. The following electrical parameters, in particular, can be varied: the response voltage, in particular the static response DC voltage or the dynamic response surge voltage, the insulation resistance, the surge arrester capacitance, the arc running voltage, the arc corona voltage, the corona-to-arc transition current and the minimum current of the surge arrester, below the threshold value of which the surge arrester extinguishes. The model thus behaves according to the specifications in a product data sheet.

The model used for the method can be designed using PSpice basic components and as a result can easily be integrated into a simulation and if appropriate transferred to other platforms, for example 5-Spice and other derivatives. The simulation model used to implement the method is based on the combination of analog, switching and calculating components of a Spice library for creating a scalable finite state machine which can be used to imitate the electrical properties of arbitrary gas-filled surge arresters or spark gaps.

BRIEF DESCRIPTION OF THE DRAWINGS

The invention is explained in greater detail below with reference to figures which show exemplary embodiments of the present invention.

In the figures:

FIG. 2 shows one embodiment of a computer-implementable method for simulating the electrical behavior of a surge arrester; and FIG. 3 shows one embodiment of a computer comprising a computer program product for performing a computer-implementable method for simulating the electrical behavior of a surge arrester.

DETAILED DESCRIPTION OF ILLUSTRATIVE EMBODIMENTS

Figure 1:
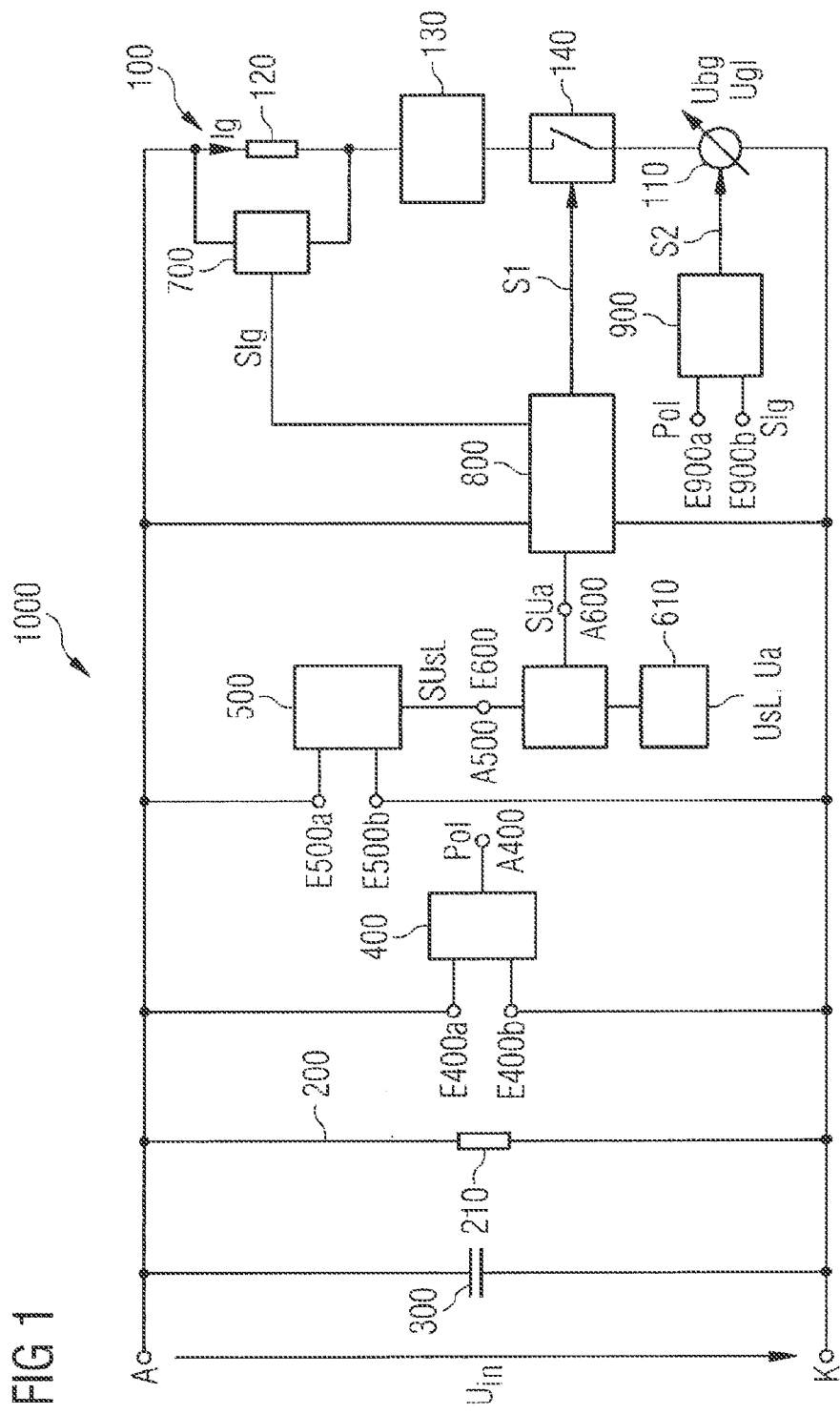
FIG. 1 shows one embodiment of a model for applying a computer-implementable method for simulating the electrical behavior of a surge arrester.

FIG. 1 shows a model 1000 for simulating the behavior of a gas-filled surge arrester or a spark gap. The model comprises an anode terminal A and a cathode terminal K for applying an input voltage Uin. A switchable current path 100 is arranged between the anode A and the cathode K. The switchable current path 100 comprises a controllable voltage source no, a resistor 120, a circuit for current limiting 130 and a controllable switch 140. The controllable voltage source no, the resistor 120, the current limiting circuit 130 and the controllable switch 140 are connected in series between the anode A and the cathode K in the current path 100.

The current path can be switched into a conducting or blocked state by means of the controllable switch 140. In the conducting state of the current path 100 a current flow occurs between the anode A and the cathode K if the input voltage Uin is applied between the anode and cathode terminals. The circuit 130 provided for current limiting can have for example a resistor and an inductance connected in parallel therewith, which are connected between the resistor 120 and the controllable switch 140. In the open state of the controllable switch 140, the current path 100 is switched into the blocked state. The current flow in the current path 100 is interrupted in the blocked state of the current path 100.

The circuit model 1000 furthermore comprises a current path 200 having a resistance 210 which is connected between the anode terminal A and the cathode terminal K. The resistance 210 can have the magnitude of the insulation resistance of the surge arrester and is at least 1 GΩ, for example. A capacitor 300 is furthermore arranged between the anode and cathode terminals. The capacitor 300 is connected in parallel with the resistance 210. The capacitor 300 can have a capacitance having the magnitude of the surge arrester capacitance of the surge arrester. The surge arrester capacitance may be at least 0.2 pF for example.

The circuit model 1000 of the surge arrester furthermore comprises a circuit block 400 for determining a polarity of the input voltage Uin. The circuit block 400 can be arranged between the anode terminal A and the cathode terminal K. By way of example, an input terminal E400a of the circuit block 400 can be connected to the anode terminal A and an input terminal E400b of the circuit block 400 can be connected to the cathode terminal K. A signal Pol identifying the polarity of the input voltage Uin is output at an output terminal A400 of the circuit block 400. By means of the circuit block 400 it is possible to determine what polarity was applied between the anode A and the cathode K at the last instant before the breakdown of the surge arrester.

The circuit model 1000 furthermore comprises a circuit block 500 for determining a voltage rise of the input voltage Uin between the anode and the cathode. The circuit block 500 can have an input terminal E500a connected to the anode terminal A and an input terminal E500b connected to the cathode terminal K. The circuit block 500 can determine for example an absolute value of the first derivative of the input voltage Uin. The circuit block 500 provides at an output terminal A500 a signal SUsl identifying the determined voltage rise or the absolute value of the first derivative of the input voltage Uin. The signal SUsl represents for example a voltage rise in the unit V/μs.

The circuit model 1000 furthermore comprises a circuit block 600 for determining a level of a response voltage Ua of the surge arrester. The response voltage may be the static response DC voltage or the dynamic response surge voltage of the surge arrester. The response voltage indicates that level of the input voltage Uin which when exceeded, results in the ignition of the surge arrester. The circuit block 600 has an input terminal E600 for applying the voltage signal SUsl and an output terminal A600 for providing a signal SUa identifying the determined level of the response voltage Ua.

The circuit block 600 can access for example a memory 610 in which a table having pairs of values (x1, y1), (x2, y2), ..., (xn, yn) is stored. A first value x of each pair of values indicates for example the value of a voltage rise Usl of the input voltage Uin. A second value y of each pair of values indicates a level of the response voltage Ua which is assigned to the value of the voltage rise Usl. A look-up table in the format (x1, y1), (x2, y2), ..., (xn, yn) is thus stored in the memory 610, wherein the values x1, x2, ..., xn indicate different voltage rises Usl, for example in V/μs, and the values y1, y2, ..., yn indicate the associated levels of the response voltage Ua. The circuit block 600 is designed to determine the associated response voltage Ua by means of the table stored in the memory 610 for the determined voltage rise Usl of the input voltage and to provide it as the signal SUa at the output terminal A600.

The circuit block 600 can be designed for example in such a way that it determines the associated level of the response voltage Ua for a determined value of the voltage rise Usl of the input voltage Uin by means of the Look-up table. The circuit block 600 can be designed to determine a level of the response voltage by interpolation between two adjacent levels of the response voltage stored in the table of the memory 610 if the signal SUa indicates a value of a voltage rise Usl which is not stored in the table of the memory 610. The level of the response voltage Uin is interpolated for example between a level of the response voltage which is assigned to a value—stored in the memory 610—of the voltage rise of the input voltage below the determined voltage rise Usl and a level of the response voltage which is assigned to a value—stored in the memory 610—of the voltage rise of the input voltage above the determined value of the voltage rise Usl.

The circuit model 1000 comprises a circuit block 700 for determining a current Ig in the current path 100. The circuit block 700 is designed to determine a voltage drop at the resistor 120. From the determined voltage level and the value of the resistor 120, the surge arrester current Ig in the current path 100 can be determined by means of the circuit block 700. For this purpose, the voltage determined across the resistor 120 is multiplied for example by a conductance of the resistor 120. The circuit block 700 provides on the output side a signal SIg identifying the determined current Ig.

The circuit model 1000 of the surge arrester furthermore has a circuit block 800 for generating a control signal S1 for controlling the controllable switch 140 in the conducting or blocking state. The circuit block 800 is connected to the anode terminal A and the cathode terminal K. Furthermore, the determined level of the response voltage Ua and the determined level of the surge arrester current Ig are fed to the circuit block 800.

The circuit block 800 is designed to generate the control signal S1 for controlling the controllable switch 140 in the conducting state if the level of the input voltage Uin is greater than the determined level of the response voltage Ua or the current Ig through the surge arrester or the current path 100 of the model is greater than the minimum current Imin, below the threshold value of which the surge arrester extinguishes. In all other cases, the control signal S1 is generated by the circuit block 800 in such a way that the controllable switch 140 is controlled in the blocked state. If the controllable switch 140 is controlled in the open or non-conducting state, the surge arrester is operated in the inactive or extinguished state. If the circuit block 800 switches the controllable switch 140 into the closed or conducting state, the surge arrester has ignited, such that the current Ig can flow through the surge arrester or the current path 100.

The circuit model 1000 furthermore has a circuit block 900 having an input terminal E900a for applying the signal Pol identifying the polarity of the input voltage Uin. The circuit block 900 furthermore has an input terminal E900b for applying the signal SIg identifying the level of the current Ig determined by the circuit block 700. The circuit block 900 generates on the output side a control signal S2 for setting a voltage level generated by the controllable voltage source no.

The circuit block 900 can be designed to set the level of an arc running voltage Ubg of the surge arrester by means of the control signal S2 at the controllable voltage source no if the current Ig generated in the current path 100 is greater than the level of an arc transition current. The level of the arc transition current is that current level at which the surge arrester changes from the corona discharge to the arc discharge. The circuit block 900 is furthermore designed to generate the control signal S2 in such a way that the controllable voltage source no generates the voltage generated by it with the level of an arc corona voltage Ugl of the surge arrester if the current Ig generated in the current path 100 is less than the level of the arc transition current or equal to the level of the arc transition current. Furthermore, the circuit block 900 can be designed to generate the voltage generated by the controllable voltage source no with a positive polarity if the level of the input voltage Uin has a positive polarity, and to generate the level of the voltage of the controllable voltage source no with a negative polarity if the level of the input voltage Uin has a negative polarity.

By means of the controllable voltage source no, therefore, the positive arc running voltage is set in the current path 100 if the input voltage Uin is positive and the current Ig in the current path 100 is greater than the arc transition current. In the other case, if the input voltage Uin is positive and the current Ig in the current path 100 is less than the arc transition current, the controllable voltage source no generates the arc corona voltage Ugl with positive polarity. If the polarity of the input voltage Uin is negative, the controllable voltage source no generates correspondingly negative voltage values of the arc running voltage Ubg or of the arc corona voltage Ugl.

FIG. 2 shows an algorithm 10 for illustrating the sequence of a computer-implementable method for simulating the electrical behavior of a surge arrester or of a spark gap. The method for simulating the behavior of the surge arrester or of the spark gap is based on the circuit model 1000 shown in FIG. 1. In a method step 11, an input voltage Uin is applied between the anode terminal A and the cathode terminal K of the circuit model 1000. In a subsequent method step 12, a polarity of the input voltage Uin is determined by means of the circuit block 400. During a subsequent method step 13, the circuit block 900 sets a first level of a voltage of the controllable voltage source no with a polarity dependent on the polarity of the input voltage Uin. By way of example, the controllable voltage source no can be driven by the circuit block 900 in such a way that the controllable voltage source no generates a level of the arc corona voltage Ugl in the current path 100.

In a subsequent method step 14, a voltage rise Usl of the input voltage Uin between the anode terminal A and the cathode terminal K of the surge arrester is determined. The voltage rise can be determined by means of the circuit block 500. In a subsequent method step 15, a level of a response voltage Ua of the surge arrester is determined depending on the determined value of the voltage rise Usl of the input voltage by means of the circuit block 600.

For determining the level of the response voltage, by way of example, a table stored in the memory 610 can be accessed. From the pairs of values (x1, y1), (x2, y2), . . . , (xn, yn) stored in the table, a first value x of each pair of value indicates the value of a voltage rise of the input voltage Uin and a second value y of each pair of values indicates a level of the response voltage assigned to the value of the voltage rise. In method step 15, for example, that level of the response voltage Ua which is assigned to the value of the determined voltage rise Usl of the input voltage Uin can be determined with the aid of the look-up table stored in the memory 610.

If the determined voltage rise Usl of the input voltage is not stored in the table, a level of the response voltage Ua can be determined by interpolation of the level of the response voltage between at least two of the levels of the response voltage which are stored in the table. By way of example, the level of the response voltage can be determined by interpolation between the level of a response voltage which is assigned to a value of the voltage rise of the input voltage below the determined voltage rise of the input voltage and a level of the response voltage which is assigned to a value of a voltage rise of the input voltage above the determined value of the voltage rise of the input voltage.

In the subsequent method steps, the current path 100 is switched into the conducting or blocked state depending on the level of the input voltage Uin and the determined level of the response voltage Ua. In a method step 16, for this purpose, for example, the circuit block 800 checks whether the level of the input voltage Uin is greater or less than the determined level of the response voltage Ua.

If it is ascertained in method step 16 for example that the level of the input voltage Uin is less than or equal to the determined level of the response voltage Ua, the controllable switch 140 is controlled in the blocked state in a method step 17, such that the current path 100 is interrupted. By contrast, if it is ascertained that the level of the input voltage Uin is greater than the determined level of the response voltage Ua, the controllable switch 140 is controlled in the conducting state in a method step 18, such that the current path 100 is switched from the blocked state into the conducting state.

In a subsequent method step 19, a current Ig is generated in the current path 100 at a first time if the current path 100 is switched into the conducting state. In a subsequent method step 20, a level of the current Ig generated at the first time in the current path 100 is determined.

In a subsequent method step 21, the controllable voltage source no is driven by the circuit block 900 depending on the level of the current Ig determined at the first time in such a way that the controllable voltage source generates the first level of a voltage, for example the level of the arc corona voltage Ugl of the surge arrester, or a second level—different than the first level—of a voltage, for example the level of the arc running voltage Ubg of the surge arrester. Furthermore, in a method step 21, a polarity of the voltage of the controllable voltage source no is set by the circuit block 900 depending on the polarity of the level of the input voltage Uin. For this purpose, the signal Pol identifying the polarity of the input voltage Uin and the signal SIg indicting the level of the current Ig in the current path 100 are applied to the input terminals E900a and E900b and the circuit block 900 generates the control signal S2 for setting the level of the voltage to be generated by the controllable voltage source.

By way of example, the controllable voltage source no is driven by the circuit block 900 with the control signal S2 in such a way that the controllable voltage source no generates a voltage having the first level, for example the level of the arc corona voltage Ugl of the surge arrester, if the level—determined at the first time—of the current Ig generated in the current path 100 is less than the level of the arc transition current or equal to the level of the arc transition current. In this case, the level of the arc transition current is that current level at which the surge arrester changes from the corona discharge to the arc discharge. The controllable voltage source no can furthermore be driven by the circuit block 900 with the control signal S2 in such a way that the controllable voltage source no generates the voltage with the second level, for example the level of the arc running voltage Ubg of the surge arrester, if the determined level of the current Ig generated at the first time in the current path 100 is greater than the level of the arc transition current.

The controllable voltage source no can be driven by means of the control signal S2 in such a way that the controllable voltage source no generates the first and second levels of the voltage with a positive polarity if the level of the input voltage Uin has a positive polarity. Conversely, the first and second levels of the voltage of the controllable voltage source can be set with a negative polarity if the level of the input voltage Uin has a negative polarity. The setting of the polarity of the voltage to be generated by the controllable voltage source is carried out in method step 21.

In a subsequent method step 22, the current Ig in the current path 100 is generated at a second time succeeding the first time with a level dependent on the level of the input voltage Uin and the set level Ugl, Ubg of the voltage of the controllable voltage source no if the current path 100 is switched into the conducting state.

In a subsequent method step 23, the level of the current Ig generated at the second time in the current path 100 is determined. In a subsequent method step 24, a check is made to establish whether the determined level of the current generated at the second time in the current path 100 is greater or less than a level of the minimum current Imin of the surge arrester. The level of the minimum current Imin of the surge arrester is that current level at which the surge arrester extinguishes. If it is ascertained that the determined level of the current Ig generated at the second time in the current path 100 is less than or equal to the level of the minimum current of the surge arrester, the controllable switch no is switched into the blocked state in a method step 25, such that the current path 100 is also operated in the blocked state.

By contrast, if it was ascertained in method step 24 that the determined level of the current generated at the second time in the current path 100 is greater than a level of the minimum current Imin of the surge arrester, the current path 100 continues to be operated in the conducting state. If the current path 100 continues to be operated in the conducting state, the level of the voltage of the controllable voltage source no is then set again in method step 21.

As explained above, the level of the voltage of the controllable voltage source no is generated in method step 21 with the first level, for example the level of the arc corona voltage Ugl of the surge arrester, if the level of the current Ig then generated at the second time in the current path 100 is less than the level of the arc transition current or equal to the level of the arc transition current. The level of the voltage of the controllable voltage source no is generated in method step 21 with the second level, for example the level of the arc running voltage Ubg of the surge arrester, if the determined level of the current Ig generated at the second time in the current path 100 is greater than the level of the arc transition current. The level of the set voltage of the controllable voltage source no is set in method step 21 with a positive polarity if the level of the input voltage Uin has a positive polarity. Conversely, the level of the voltage of the controllable voltage source is set in method step 21 with a negative polarity if the level of the input voltage Uin has a negative polarity.

If the controllable switch 140 was controlled in the blocked state in method step 17 or in method step 25, that is to say that the surge arrester is not ignited, no surge arrester current Ig flows in the current path 100. In this case, only the insulation resistance 210 and the surge arrester capacitance 300 are effective between the anode A and the cathode K.

The method sequence depicted schematically in FIG. 2 can be embodied as a computer-implementable program that can be integrated into a circuit simulation program. The computer-implementable program can be made available for example as a module or as a function block in a Spice library. The circuit model of the surge arrester shown in FIG. 1 can be constructed from a combination of analog components, for example the resistors 120 and 210 and also the capacitor 310 or the controllable voltage source no, switching components, for example the controllable switch 140 and calculating components, for example the circuit blocks 400 to 900.

The circuit block 400 can contain for example a voltage-controlled voltage source which, depending on the input voltage, generates the signal Pol with a level of +1 V on the output side if the input voltage Uin is greater than or equal to a voltage of 0 V. Otherwise the signal Pol is generated with a voltage level of −1 V on the output side. The circuit block 500 can be designed as a voltage-controlled voltage source which generates on the output side the signal SUsl depending on the determined first derivative of the input voltage. The circuit block 600 can have the look-up table for storing pairs of values comprising the voltage rise of the input voltage and the associated response voltage. The circuit block 700 can have a voltage-controlled voltage source which generates on the output side the voltage signal SIg depending on a multiplication of the input voltage by a constant factor corresponding to the conductance of the resistor 120.

The circuit block 800 can comprise a voltage-controlled voltage source. The circuit block 800 calculates the level of the control signal S1 from the input voltage fed on the input side and the response voltage, the current through the current path 100 and the minimum current of the surge arrester as variables. By way of example, the controllable voltage source of the circuit block 800 can generate the control signal S1 on the output side with a level of 2 V if the input voltage is greater than the determined response voltage or the current Ig through the surge arrester or current path 100 is greater than the minimum current of the surge arrester. Otherwise the control signal S1 can be generated for example with a level of 0 V.

The circuit block 900 can comprise a voltage-controlled voltage source for generating the control signal S2. The circuit block determines whether the input voltage is positive or negative and whether the current level of the current Ig is greater or less than the arc transition current. If the input voltage Uin is positive and the current Ig is greater than the arc transition current, the controllable voltage source of the circuit block 900 generates the control signal S2 in such a way that the controllable voltage source no generates the level of the positive arc running voltage. Otherwise, that is to say in the case of a positive input voltage and a level of the current Ig less than or equal to the arc transition current, the control signal S2 is generated in such a way that the positive arc corona voltage is generated by the controllable voltage source 900. If the polarity of the input voltage is negative, the controllable voltage source of the circuit block 900 generates the control signal S2 in such a way that the controllable voltage source no generates the arc running voltage or the arc corona voltage with a negative level.

In order to delay the output signals, in particular of the circuit blocks 400, 600, 800 and 900, said circuit blocks can have delay circuits arranged downstream of the controllable voltage sources of the respective circuit blocks.

With the method specified in FIG. 2 and the underlying circuit model in accordance with FIG. 1, it is possible to simulate the electrical properties of arbitrary gas-filled surge arresters or spark gaps. Depending on the surge arrester to be simulated, it is possible to predefine or vary the static response DC voltage, the dynamic response voltage, the insulation resistance, the surge arrester capacitance, the arc running voltage, the arc corona voltage, the arc transition current and the minimum current.

FIG. 3 shows a computer 1 on which the method 10 can be performed. The method for simulating the electrical behavior of a surge arrester can be stored as a computer program product 2 on a computer-readable storage medium 3. The computer program product 2 comprises instructions for performing the computer-implementable method which are executable by means of a processor 4 of the computer 1.

The invention claimed is:

1. A computer-aided method for detecting errors in a design of an electrical surge arrester by simulating electrical behavior of the surge arrester, the method comprising:
   providing a model of the surge arrester having a switchable current path between an anode and a cathode of the surge arrester, wherein the current path comprises a controllable voltage source, wherein the current path is switchable into a conducting or blocked state, wherein in the conducting state of the current path a current flow through the current path occurs if an input voltage of the surge arrester is present between the anode and the cathode, and wherein in the blocked state of the current path the current flow in the current path is interrupted;
   applying the input voltage between the anode and the cathode;
   determining a polarity of the input voltage;
   setting a first level of a voltage of the controllable voltage source with a polarity depending on the polarity of the input voltage;
   determining a value of a rate of a voltage rise of the input voltage;
   determining a level of a response voltage of the surge arrester depending on the determined value of the rate of the voltage rise of the input voltage;
   switching the current path into the conducting or blocked state depending on the level of the input voltage and the determined level of the response voltage;
   determining a level of a current occurring at a first time in the current path if the current path is switched into the conducting state;
   generating the first level or a second level, which is different than the first level, of the voltage of the controllable voltage source depending on the determined level of the current occurring at the first time;
   generating a polarity of the voltage of the controllable voltage source depending on the polarity of the level of the input voltage; and
   generating the current in the current path at a second time succeeding the first time with a level depending on the level of the input voltage and the generated level of the voltage of the controllable voltage source if the current path is switched into the conducting state.

2. The method according to claim 1, wherein switching the current path comprises switching the current path from the blocked state into the conducting state if the level of the input voltage is greater than the determined level of the response voltage.

3. The method according to claim 1, wherein generating the current in the current path at the second time comprises:
   determining the level of the current generated at the second time in the current path; and
   operating the current path in the conducting state if the determined level of the current generated at the second time in the current path is greater than a level of the minimum current of the surge arrester, wherein the level of the minimum current of the surge arrester is that current level at which the surge arrester extinguishes.

4. The method according to claim 1, further comprising generating the level of the voltage of the controllable voltage source with the first level if the determined level of the current generated at the second time in the current path is less than a level of an arc transition current or equal to the level of the arc transition current, wherein the level of the arc transition current is that current level at which the surge arrester changes from a corona discharge to an arc discharge.

5. The method according to claim 4, further comprising generating the level of the voltage of the controllable voltage source with the second level if the determined level of the current generated at the second time in the current path is greater than the level of an arc transition current.

6. The method according to claim 5, comprising generating a positive polarity of the first and second levels of the voltage of the controllable voltage source if the level of the input voltage has a positive polarity and generating a negative polarity of the first and second levels of the voltage of the controllable voltage source if the level of the input voltage has a negative polarity.

7. The method according to claim 5, wherein the first level of the voltage of the controllable voltage source corresponds to a level of an arc glow voltage of the surge arrester, and wherein the second level of the voltage of the controllable voltage source corresponds to a level of an arc corona voltage of the surge arrester.

8. The method according to claim 1, further comprising storing a table having pairs of values, wherein a first value of each pair of values indicates a value of the voltage rise of the input voltage, and wherein a second value of each pair of values indicates a level corresponding to the value of the response voltage assigned to the voltage rise of the input voltage.

9. The method according to claim 8, wherein determining the level of the response voltage comprises determining the level of the response voltage from the table which is assigned to the value of the determined voltage rise of the input voltage.

10. The method according to claim 8, wherein determining the level of the response voltage comprises determining the level of the response voltage by interpolating the level of the response voltage between at least two levels of the response voltage that are stored in the table.

11. The method according to claim 1, wherein the model of the surge arrester further comprises a further current path between the anode and the cathode of the surge arrester, the further current path being connected in parallel with the current path; and
wherein the method further comprises generating the current through the surge arrester in the further current path if the current path is switched into the blocked state.

12. The method according to claim 11, wherein the model of the surge arrester has a resistance having a magnitude of an insulation resistance of the surge arrester in the further current path.

13. The method according to claim 12, wherein the model of the surge arrester has a capacitor connected in parallel with the resistance, wherein the capacitor has a capacitance having a magnitude of a surge arrester capacitance of the surge arrester.

14. The method according to claim 1, wherein the method is implemented by executing a program that is integrated into a circuit simulation program.

15. A computer program product for storage on a computer-readable storage medium comprising instructions for performing a computer-aided method for detecting errors in a design of an electrical surge arrester by simulating electrical behavior of a surge arrester according to a method comprising:
providing a model of the surge arrester having a switchable current path between an anode and a cathode of the surge arrester, wherein the current path comprises a controllable voltage source, wherein the current path is switchable into a conducting or blocked state, wherein in the conducting state of the current path a current flow through the current path occurs if an input voltage of the surge arrester is present between the anode and the cathode, and wherein in the blocked state of the current path the current flow in the current path is interrupted;
applying the input voltage between the anode and the cathode;
determining a polarity of the input voltage;
setting a first level of a voltage of the controllable voltage source with a polarity depending on the polarity of the input voltage;
determining a value of a rate of a voltage rise of the input voltage;
determining a level of a response voltage of the surge arrester depending on the determined value of the rate of the voltage rise of the input voltage;
switching the current path into the conducting or blocked state depending on the level of the input voltage and the determined level of the response voltage;
determining a level of a current occurring at a first time in the current path if the current path is switched into the conducting state;
generating the first level or a second level, which is different than the first level, of the voltage of the controllable voltage source depending on the determined level of the current occurring at the first time;
generating a polarity of the voltage of the controllable voltage source depending on the polarity of the level of the input voltage; and
generating the current in the current path at a second time succeeding the first time with a level depending on the level of the input voltage and the generated level of the voltage of the controllable voltage source if the current path is switched into the conducting state.

16. A computer-aided method for detecting errors in a design of an electrical surge arrester by simulating electrical behavior of the surge arrester, the method comprising:
providing a model of the surge arrester having a switchable current path between an anode and a cathode of the surge arrester, wherein the current path comprises a controllable voltage source, wherein the current path is switchable into a conducting or blocked state, wherein in the conducting state of the current path a current flow through the current path occurs if an input voltage of the surge arrester is present between the anode and the cathode, and wherein in the blocked state of the current path the current flow in the current path is interrupted;
applying the input voltage between the anode and the cathode;
determining a polarity of the input voltage;
setting a first level of a voltage of the controllable voltage source with a polarity depending on the polarity of the input voltage;
determining a value of a rate of a voltage rise of the input voltage;
determining a level of a response voltage of the surge arrester depending on the determined value of the rate of the voltage rise of the input voltage;
switching the current path into the conducting or blocked state depending on the level of the input voltage and the determined level of the response voltage;
determining a level of a current occurring at a first time in the current path if the current path is switched into the conducting state;
generating the first level or a second level, which is different than the first level, of the voltage of the controllable voltage source depending on the determined level of the current occurring at the first time;

generating a polarity of the voltage of the controllable voltage source depending on the polarity of the level of the input voltage;

generating the current in the current path at a second time succeeding the first time with a level depending on the level of the input voltage and the generated level of the voltage of the controllable voltage source if the current path is switched into the conducting state; and generating the level of the voltage of the controllable voltage source with the first level if the determined level of the current generated at the second time in the current path is less than a level of an arc transition current or equal to the level of the arc transition current, wherein the level of the arc transition current is that current level at which the surge arrester changes from a corona discharge to an arc discharge;

wherein the method is implemented by executing a program that is integrated into a circuit simulation program.

17. The method according to claim 16, further comprising generating the level of the voltage of the controllable voltage source with a second level if the determined level of the current generated at the second time in the current path is greater than the level of an arc transition current.

18. The method according to claim 17, comprising generating a positive polarity of the first and second levels of the voltage of the controllable voltage source if the level of the input voltage has a positive polarity and generating a negative polarity of the first and second levels of the voltage of the controllable voltage source if the level of the input voltage has a negative polarity.

19. The method according to claim 17, wherein the first level of the voltage of the controllable voltage source corresponds to a level of an arc glow voltage of the surge arrester, and wherein the second level of the voltage of the controllable voltage source corresponds to a level of an arc corona voltage of the surge arrester.

* * * * *